(12) United States Patent
Krishnan

(10) Patent No.: US 10,545,522 B2
(45) Date of Patent: Jan. 28, 2020

(54) TEMPERATURE DRIFT COMPENSATION

(71) Applicant: TEXAS INSTRUMENTS INCORPORATED, Dallas, TX (US)

(72) Inventor: Sandeep Shylaja Krishnan, Kozhikode (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 26 days.

(21) Appl. No.: 15/928,395

(22) Filed: Mar. 22, 2018

(65) Prior Publication Data

US 2018/0292852 A1    Oct. 11, 2018

(30) Foreign Application Priority Data

Apr. 7, 2017  (IN) ................ 20171012623

(51) Int. Cl.
*G05F 1/575*   (2006.01)
*H03M 1/08*    (2006.01)
*G05F 1/46*    (2006.01)

(52) U.S. Cl.
CPC .............. *G05F 1/575* (2013.01); *G05F 1/468* (2013.01); *H03M 1/089* (2013.01)

(58) Field of Classification Search
CPC .................................. G05F 1/567; G05F 1/575
See application file for complete search history.

(56) References Cited

U.S. PATENT DOCUMENTS 8,102,201 B2 *   1/2012   Marinca ............... G05F 3/30
                                              323/314

* cited by examiner

*Primary Examiner* — Hai L Nguyen
(74) *Attorney, Agent, or Firm* — John R. Pessetto; Charles A. Brill; Frank D. Cimino

(57) ABSTRACT

A voltage reference circuit includes a bandgap circuit and a temperature compensation circuit. The temperature compensation circuit includes a first trim circuit, a second trim circuit, and a resistive digital-to-analog converter. The resistive digital-to-analog converter is coupled to the first trim circuit, the second trim circuit, and the bandgap circuit. The resistive digital-to-analog converter is configured to generate a temperature compensation voltage, and to provide the temperature compensation voltage to the bandgap circuit.

10 Claims, 4 Drawing Sheets

TEMPERATURE DRIFT COMPENSATION

RELATED APPLICATIONS

This application claims priority to India Provisional Application No. 201741012623, filed Apr. 7, 2017, which is hereby incorporated by reference.

BACKGROUND

Various analog circuits, voltage reference circuits for example, suffer from offset error. Offset error results from mismatch of circuit components. For example, in an amplifier, mismatch of differential input transistors can cause the amplifier to produce a non-zero output voltage when the amplifier input voltage is zero. Offset error can detrimentally affect the operation of a circuit receiving a signal that includes an offset voltage.

Attempts are made to minimize offset error in a variety of applications. However, even after compensating for offset error, the factors that produce the offset error can vary with temperature, causing a variation in the offset error with temperature. Such variation is referred to as "offset drift."

SUMMARY

Temperature compensation circuits that correct for offset that changes with temperature are disclosed herein. In one example, a voltage reference circuit includes a bandgap circuit and a temperature compensation circuit. The temperature compensation circuit includes a first trim circuit, a second trim circuit, and a first resistive digital-to-analog converter. The resistive digital-to-analog converter is coupled to the first trim circuit, the second trim circuit, and the bandgap circuit. The first resistive digital-to-analog converter is configured to generate a temperature compensation voltage, and to provide the temperature compensation voltage to the bandgap circuit.

In another example, a method for trimming a voltage reference circuit includes adjusting an output voltage of a bandgap circuit to a reference voltage at a first temperature. The method also includes generating a temperature compensation voltage to adjust the output voltage as a function of temperature. The generating includes setting a first resistive digital-to-analog converter to produce a weighted sum of a voltage proportional to absolute temperature and a voltage complementary to absolute temperature. The method further includes providing the temperature compensation voltage to the bandgap circuit to adjust the output voltage.

In a further example, a temperature compensation circuit includes a bandgap circuit, a proportional to absolute temperature voltage generation circuit, a complementary to absolute temperature voltage generation circuit, a first resistive digital-to-analog converter, a second resistive digital-to-analog converter, and a third resistive digital-to-analog converter. The first resistive digital-to-analog converter is coupled to an output of the proportional to absolute temperature voltage generation circuit. The second resistive digital-to-analog converter is coupled to an output of the complementary to absolute temperature voltage generation circuit. The third resistive digital-to-analog converter coupled to an output of the first resistive digital-to-analog converter, an output the second resistive digital-to-analog converter, and an input of the bandgap circuit.

BRIEF DESCRIPTION OF THE DRAWINGS

For a detailed description of various examples, reference will now be made to the accompanying drawings in which.

DETAILED DESCRIPTION

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

To compensate for offset drift with changing temperature, temperature compensation circuits generate a temperature compensation signal that changes with temperature and reduces the offset present at the output of a target device, such as voltage reference circuit. Some temperature drift compensation circuits use current output digital-to-analog converters to set the parameters of the temperature compensation signal. The current output digital-to-analog converters generate flicker noise that contributes significantly to low frequency noise at the output of the compensated device. The low frequency noise is difficult to filter and can detrimentally affect the operation of a receiving circuit. The noise can be reduced by increasing power in the current output digital-to-analog converters, but increasing power is undesirable in low power applications.

The temperature compensation circuits disclosed herein reduce low frequency noise while maintaining low power consumption. The temperature compensation circuits of the present disclosure reduce low frequency noise by providing a temperature compensation voltage rather than a temperature compensation current. In implementations of a temperature compensation circuit, voltage output digital-to-analog converters, rather than current output digital-to-analog converters, are used to generate a temperature compensation voltage. The voltage output digital-to-analog converters are resistive devices that produce substantially less low frequency noise than current output digital-to-analog converters.

Figure 1:
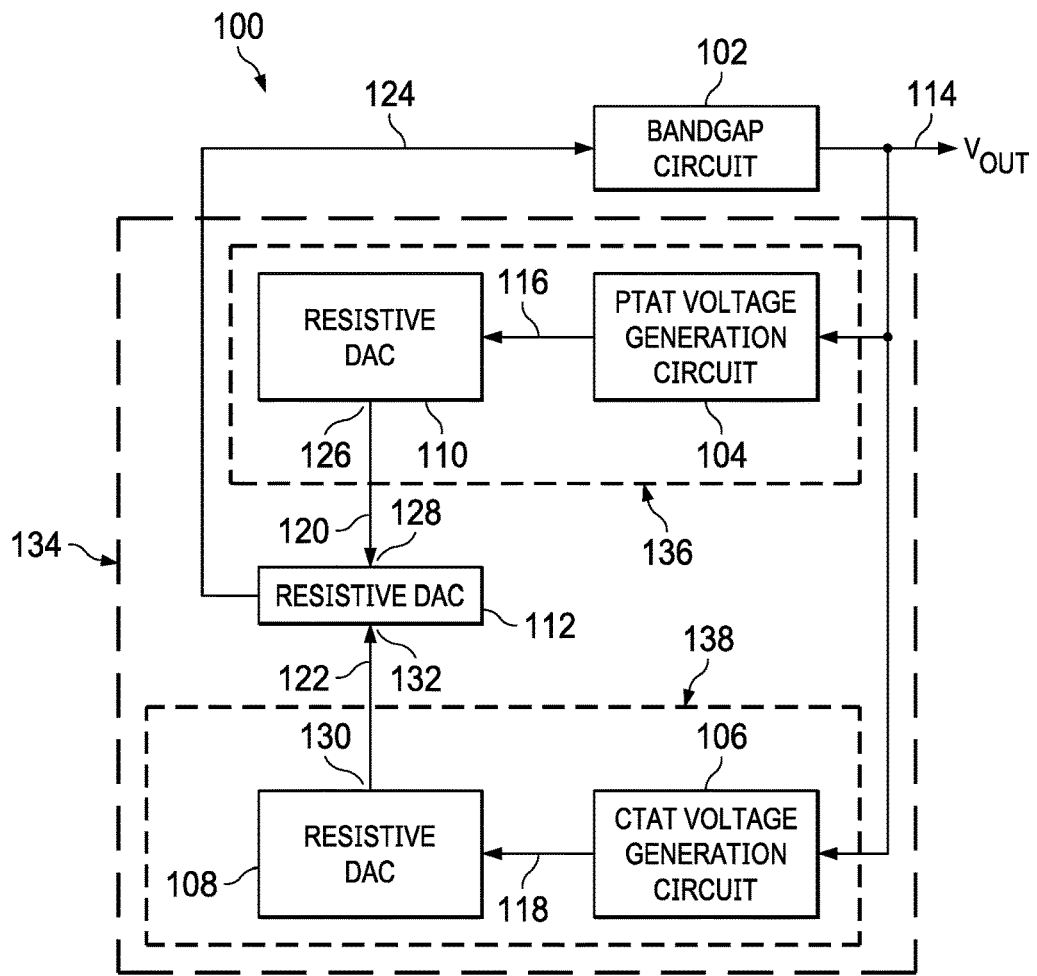
FIG. 1 shows a block diagram for a voltage reference circuit that includes voltage output temperature compensation in accordance with the present disclosure.

FIG. 1 shows a block diagram for a voltage reference circuit 100 that includes voltage output temperature compensation in accordance with the present disclosure. The voltage reference circuit 100 includes a bandgap circuit 102 and a temperature compensation circuit 134. The temperature compensation circuit 134 includes a trim circuit 136, a trim circuit 138, and a resistive digital-to-analog converter 112. The trim circuit 136 includes a proportional-to-absolute-temperature (PTAT) voltage generation circuit 104 and a resistive digital-to-analog converter 110. The trim circuit 138 includes a complementary-to-absolute-temperature (CTAT) voltage generation circuit 106 and a resistive digital-to-analog converter 108. The PTAT voltage generation circuit 104 and the CTAT voltage generation circuit 106 are coupled to an output of the bandgap circuit 102. The resistive digital-to-analog converter 108 is coupled to an output of the CTAT voltage generation circuit 106. The resistive digital-to-analog converter 110 is coupled to an output of the PTAT voltage generation circuit 104. The resistive digital-to-analog converter 112 is coupled to an output of the resistive digital-to-analog converter 108 and to an output of the resistive digital-to-analog converter 110. An output of the resistive digital-to-analog converter 112 is fed back to the bandgap circuit 102 in some implementations of the voltage reference circuit 100 to adjust (e.g., temperature compensate) the output of the bandgap circuit 102. In some implementations of the voltage reference circuit 100 the output of the resistive digital-to-analog converter 112 is not fed back to the bandgap circuit 102, and is representative of the temperature compensated output of the voltage reference circuit 100.

The bandgap circuit 102 generates an output voltage that approximately corresponds to the bandgap energy of silicon (e.g., about 1.2 volts), and is relatively constant over temperature. That is, the drift over temperature is relatively small. Some applications require that the temperature drift be further reduced and the temperature compensation circuit of the voltage reference circuit 100 operates to reduce the drift of the output voltage 114 over temperature. During manufacture of the voltage reference circuit 100, the output voltage 114 is adjusted to equal a given reference voltage at a selected temperature.

The PTAT voltage generation circuit 104 generates an output voltage 116 that is proportional to absolute temperature. The output voltage 116 increases with temperature. The output voltage 116 is provided to the resistive digital-to-analog converter 110 as input. During manufacture of the voltage reference circuit 100, the resistive digital-to-analog converter 110 is set to scale the output voltage 116 such that the output voltage 120 of the resistive digital-to-analog converter 110 equals the given reference voltage at the selected temperature.

The CTAT voltage generation circuit 106 generates an output voltage 118 that is complementary to absolute temperature. The output voltage 118 decreases with temperature. The output voltage 118 is provided to the resistive digital-to-analog converter 108 as input. During manufacture of the voltage reference circuit 100, the resistive digital-to-analog converter 108 is set to scale the output voltage 118 such that the output voltage 122 of the resistive digital-to-analog converter 108 equals the given reference voltage at the selected temperature.

The output voltage 120 and the output voltage 122 are provided to the resistive digital-to-analog converter 112 as inputs. For example, an output terminal 126 of the resistive digital-to-analog converter 110 is coupled to an input terminal 128 of the resistive digital-to-analog converter 112, and an output terminal 130 of the resistive digital-to-analog converter 108 is coupled to an input terminal 132 of the resistive digital-to-analog converter 112. The resistive digital-to-analog converter 112 provides a weighted sum of the output voltage 120 and the output voltage 122 to form an output voltage 124 (a temperature compensation voltage). The output voltage 124 varies with temperature at a rate that compensates for the variance with temperature of the bandgap voltage generated by the bandgap circuit 102. Accordingly, the bandgap circuit 102 sums the output voltage 124 with the bandgap voltage generated by the bandgap circuit 102 to produce the output voltage 114. Because the resistive digital-to-analog converter 108, the resistive digital-to-analog converter 110, and the resistive digital-to-analog converter 112 are passive, rather than active, the low frequency noise produced to scale the output voltage 116 and output voltage 118 is reduced relative to current output digital-to-analog converters. In some implementations of the voltage reference circuit 100, the circuit area of the resistive digital-to-analog converter 108, the resistive digital-to-analog converter 110, and the resistive digital-to-analog converter 112 is less than the circuit area occupied by current output digital-to-analog converters.

Figure 2:
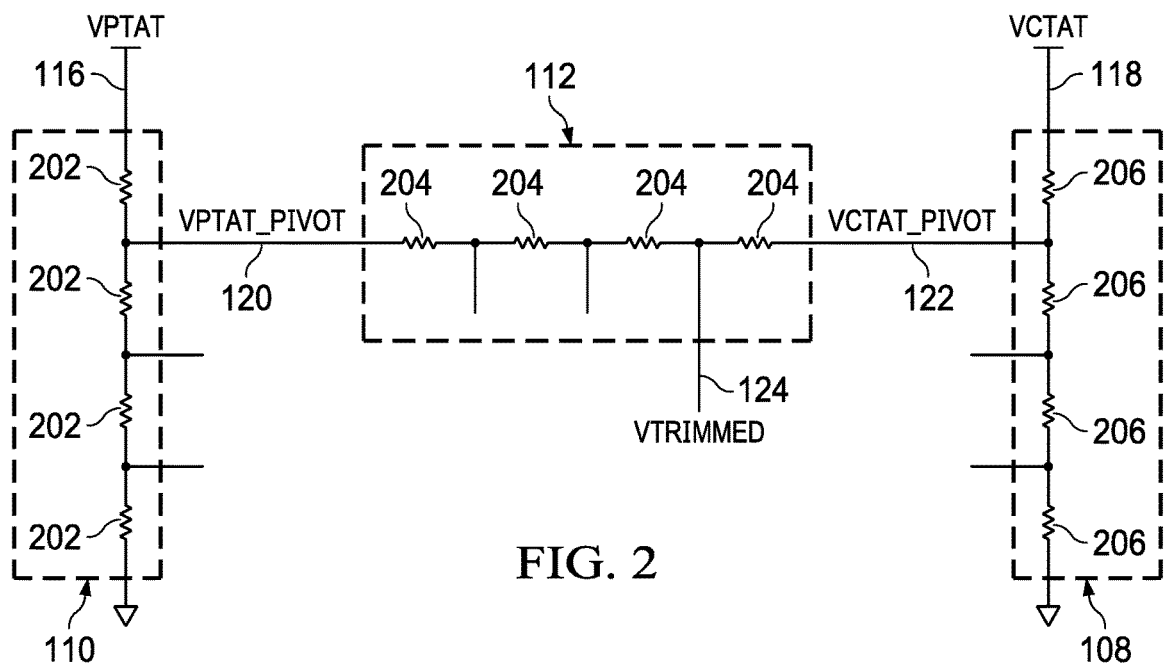
FIG. 2 shows a schematic diagram of resistive digital-to-analog converters arranged to provide voltage output temperature compensation in accordance with the present disclosure.

FIG. 2 shows a schematic diagram of the resistive digital-to-analog converter 108, the resistive digital-to-analog converter 110, and the resistive digital-to-analog converter 112 arranged to provide voltage output temperature compensation in accordance with the present disclosure. The resistive digital-to-analog converter 108 includes a plurality of resistors 206 connected in series. A tap is provided at a connection of each pair of resistors 206. Each of the taps provides a different scaling of the output voltage 118 received from the CTAT voltage generation circuit 106. While four of the resistors 206 are illustrated in FIG. 2, some implementations of the resistive digital-to-analog converter 108 may include more than four resistors 206.

The resistive digital-to-analog converter 110 includes a plurality of resistors 202 connected in series. A tap is provided at a connection of each pair of resistors 202. Each of the taps provides a different scaling of the output voltage 116 received from the PTAT voltage generation circuit 104. While four of the resistors 202 are illustrated in FIG. 2, some implementations of the resistive digital-to-analog converter 110 may include more than four resistors 202.

The resistive digital-to-analog converter 112 includes a plurality of resistors 204 connected in series. A tap is provided at a connection of each pair of resistors 204. Each of the taps provides a different weighting of the output voltage 120 and output voltage 122 received from the resistive digital-to-analog converter 110 and the resistive digital-to-analog converter 108 respectively. Thus, selection of the different taps of the resistive digital-to-analog converter 112 provides a different sum of the output voltage 120 and output voltage 122, where each different sum corresponds to a different slope of the output voltage 124. While four of the resistors 204 are illustrated in FIG. 2, some implementations of the resistive digital-to-analog converter 112 may include more than four resistors 204.

Figure 3:
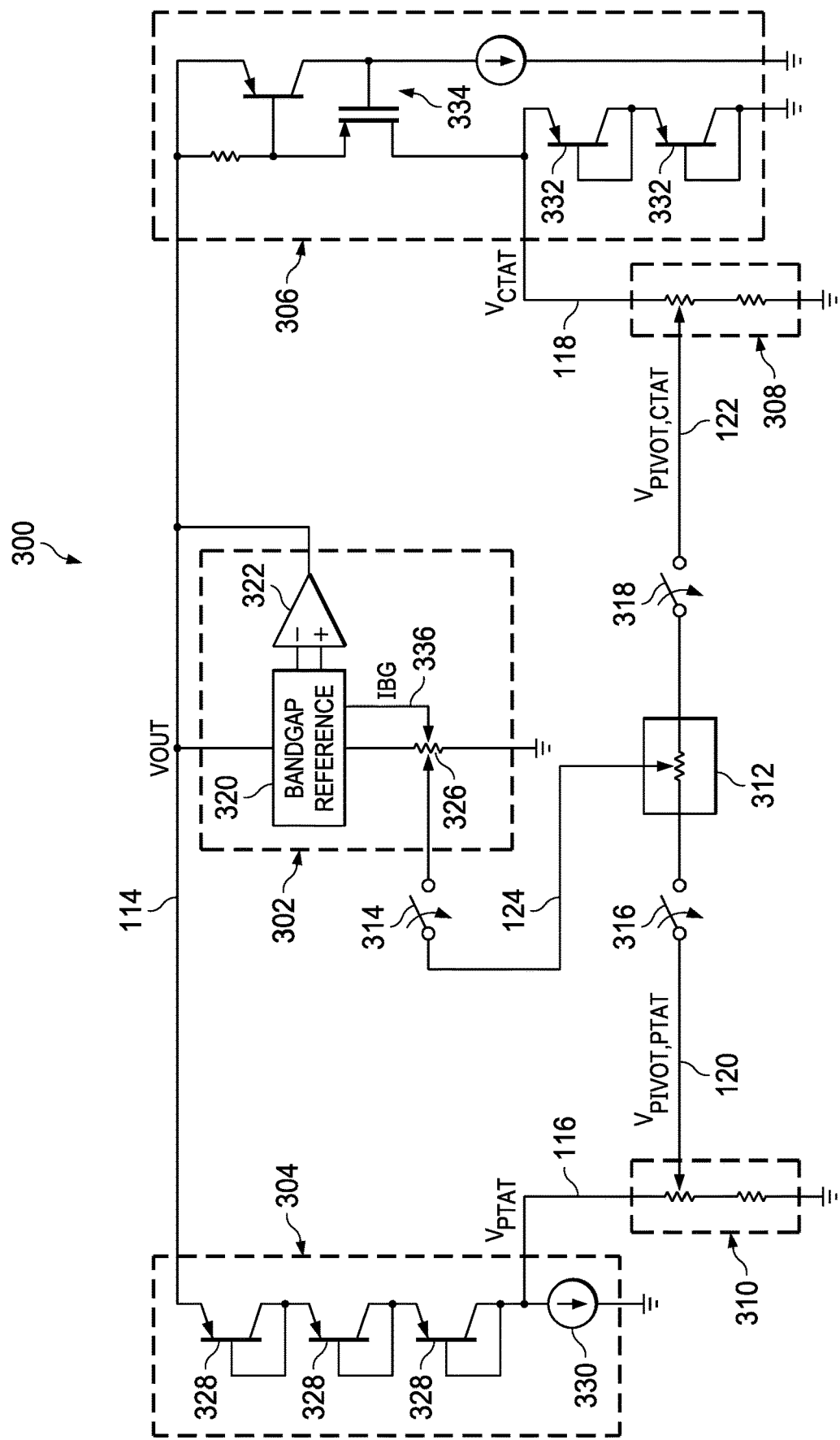
FIG. 3 shows a schematic diagram for a voltage reference circuit that includes voltage output temperature compensation implemented within a control loop of the bandgap circuit in accordance with the present disclosure.

FIG. 3 shows a schematic diagram for a voltage reference circuit 300 that includes voltage output temperature compensation implemented within a control loop of the bandgap circuit in accordance with the present disclosure. The voltage reference circuit 300 is an implementation of the voltage reference circuit 100. The voltage reference circuit 300 includes bandgap circuit 302, a PTAT voltage generation circuit 304, a CTAT voltage generation circuit 306, a resistive digital-to-analog converter 308, a resistive digital-toanalog converter 310, and a resistive digital-to-analog converter 312. The bandgap circuit 302, the PTAT voltage generation circuit 304, the CTAT voltage generation circuit 306, the resistive digital-to-analog converter 308, the resistive digital-to-analog converter 310, and the resistive digital-to-analog converter 312 are implementations of the bandgap circuit 102, the PTAT voltage generation circuit 104, the CTAT voltage generation circuit 106, the resistive digital-to-analog converter 108, the resistive digital-to-analog converter 110, and the resistive digital-to-analog converter 112 respectively.

The bandgap circuit 302 includes a bandgap reference circuit 320, a buffer amplifier 322, and a resistive digital-to-analog converter 326. The bandgap reference circuit 320 generates the bandgap voltage and the buffer amplifier 322 isolates the bandgap reference circuit 320 from the loading effects of circuits external to the bandgap circuit 302. The resistive digital-to-analog converter 326 provides for adjustment of the output voltage generated by the bandgap reference circuit 320 at a selected temperature. For example, the bandgap reference circuit 320 may include a plurality of resistors connected in series and tap points between each pair of resistors. A tap point at which the bandgap current 336 is provided to the resistive digital-to-analog converter 326 is selected to produce an output voltage 114 that equals a reference voltage.

The PTAT voltage generation circuit 304 includes one or more transistors 328. In the illustrated implementation of the PTAT voltage generation circuit 304, three transistors 328 are connected as diodes and connected in series, so that the voltage of the output voltage 116 is about three diode drop voltages lower than the voltage of the output voltage 114. Other implementations of the PTAT voltage generation circuit 304 may include a different number of transistors 328. The output voltage 114 is received as input to the transistors 328. A current source 330 couples the transistors 328 to ground. The output voltage 116 is provided at an output terminal of the transistors 328 coupled to the current source 330.

The output voltage 116 generated by the PTAT voltage generation circuit 304 is provided to the resistive digital-to-analog converter 310. The resistive digital-to-analog converter 310 operates as a programmable voltage divider to generate a scaled version of the output voltage 116. The output voltage 120 generated by the resistive digital-to-analog converter 310 is provided to the resistive digital-to-analog converter 312.

The voltage reference circuit 300 includes a switch 314, a switch 316, and a switch 318 to allow selectable isolation of the resistive digital-to-analog converter 308, the resistive digital-to-analog converter 310, and the resistive digital-to-analog converter 312 during adjustment of the resistive digital-to-analog converter 308, the resistive digital-to-analog converter 310, and resistive digital-to-analog converter 312 at manufacture. The switch 316 switchably couples the output voltage 120 to the resistive digital-to-analog converter 312.

The CTAT voltage generation circuit 306 includes one or more transistors 332. In the illustrated implementation of the CTAT voltage generation circuit 306, two transistors 332 are connected as diodes and connected in series. Other implementations of the CTAT voltage generation circuit 306 may include a different number of transistors 332. The output voltage 114 is received as input to the transistors 332 via the circuit 334, so that the voltage of the output voltage 118 is about two diode drop voltages above ground. The output voltage 118 is provided at an input terminal of the transistors 332 coupled to the circuit 334.

The output voltage 118 generated by the CTAT voltage generation circuit 306 is provided to the resistive digital-to-analog converter 308. The resistive digital-to-analog converter 308 operates as a programmable voltage divider to generate a scaled version of the output voltage 118. The output voltage 122 generated by the resistive digital-to-analog converter 308 is provided to the resistive digital-to-analog converter 312. The switch 318 switchably couples the output voltage 122 to the resistive digital-to-analog converter 312.

The resistive digital-to-analog converter 312 operates as a programmable voltage divider to produce a weighted sum of the output voltage 120 and the output voltage 122. The switch 314 switchably couples the output voltage 124 produced by the resistive digital-to-analog converter 312 to the bandgap circuit 302. The output voltage 124 is summed with the adjusted bandgap voltage produced by the bandgap circuit 302 to provide temperature compensation.

Figure 4:
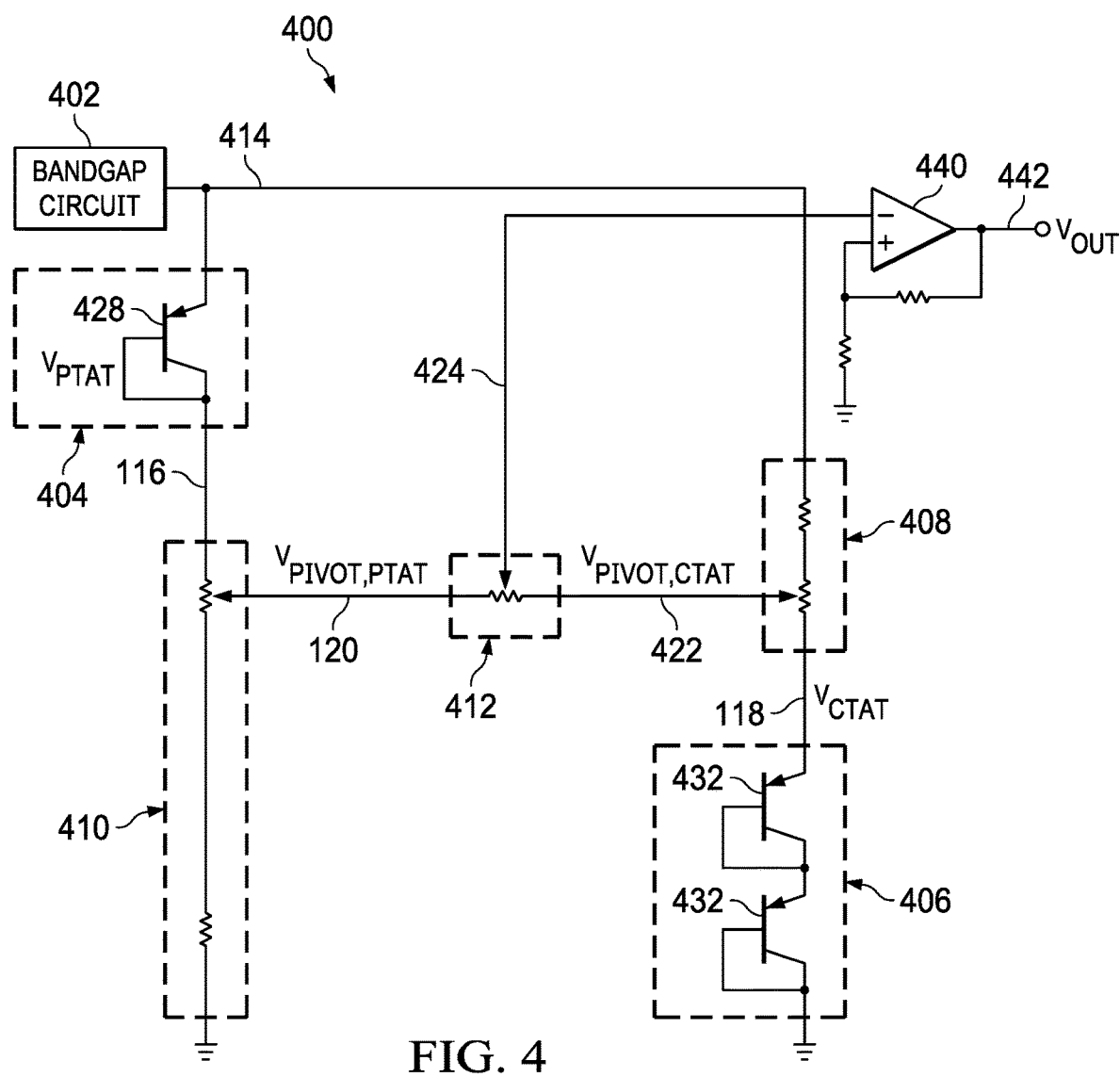
FIG. 4 shows a schematic diagram for a voltage reference circuit that includes voltage output temperature compensation implemented external to a control loop of the bandgap circuit in accordance with the present disclosure.

FIG. 4 shows a schematic diagram for a voltage reference circuit 400 that includes voltage output temperature compensation implemented external to a control loop of the bandgap circuit in accordance with the present disclosure. The voltage reference circuit 400 is an implementation of the voltage reference circuit 100. The voltage reference circuit 400 includes bandgap circuit 402, a PTAT voltage generation circuit 404, a CTAT voltage generation circuit 406, a resistive digital-to-analog converter 408, resistive digital-to-analog converter resistive digital-to-analog converter 410, and a resistive digital-to-analog converter resistive digital-to-analog converter 412. The bandgap circuit 402, the PTAT voltage generation circuit 404, the CTAT voltage generation circuit 406, the resistive digital-to-analog converter 408, the resistive digital-to-analog converter 410, and the resistive digital-to-analog converter 412 are implementations of the bandgap circuit 102, the PTAT voltage generation circuit 104, the CTAT voltage generation circuit 106, the resistive digital-to-analog converter 108, the resistive digital-to-analog converter 110, and the resistive digital-to-analog converter 112 respectively.

The bandgap circuit 402 generates the bandgap voltage, and some implementations include circuitry similar to the bandgap reference circuit 320, the buffer amplifier 322, and/or the resistive digital-to-analog converter 326. In the voltage reference circuit 400, the temperature compensation circuit does not provide feedback to the bandgap circuit 402, so the output voltage 414 generated by the bandgap circuit 402 is not temperature compensated within the bandgap circuit 402. The output voltage 414 is adjusted to equal a reference voltage at a selected temperature.

The PTAT voltage generation circuit 404 includes one or more transistors 428. In the illustrated implementation of the PTAT voltage generation circuit 404, a single transistor 428 is provided, so that the voltage of the output voltage 116 is about one diode drop voltage lower than the voltage of the output voltage 414. Other implementations of the PTAT voltage generation circuit 404 may include a different number of transistors 428. The output voltage 414 is received as input to the transistor 428. The output voltage 116 is provided at an output terminal of the transistor 428.

The output voltage 116 generated by the PTAT voltage generation circuit 404 is provided to the resistive digital-to-analog converter 410. The resistive digital-to-analog converter 410 operates as a programmable voltage divider to generate a scaled version of the output voltage 116. The output voltage 120 generated by the resistive digital-to-analog converter 410 is provided to the resistive digital-to-analog converter 412.

The CTAT voltage generation circuit 406 includes one or more transistors 432. In the illustrated implementation of the CTAT voltage generation circuit 406, two transistors 432 are connected as diodes and connected in series. Other implementations of the CTAT voltage generation circuit 406 may include a different number of transistors 432.

In the voltage reference circuit 400, the output voltage 414 is received by the resistive digital-to-analog converter 408, and provided to the CTAT voltage generation circuit 406 via the resistive digital-to-analog converter 408. The output voltage 118 is about two diode voltage drops above ground, so the voltage across the resistive digital-to-analog converter 408 is approximately the voltage of the output voltage 414 less two diode voltage drops.

The resistive digital-to-analog converter 308 operates as a programmable voltage divider to generate an output voltage 422 between the output voltage 118 and the output voltage 414. The output voltage 422 generated by the resistive digital-to-analog converter 408 is provided to the resistive digital-to-analog converter 412.

The resistive digital-to-analog converter 412 operates as a programmable voltage divider to produce a weighted sum of the output voltage 120 and the output voltage 422. The output voltage 424 produced by the resistive digital-to-analog converter 412 is provided to the buffer amplifier 440. The buffer amplifier 440 applies a selected gain to the output voltage 424 to produce the output reference voltage 442.

Figure 5:
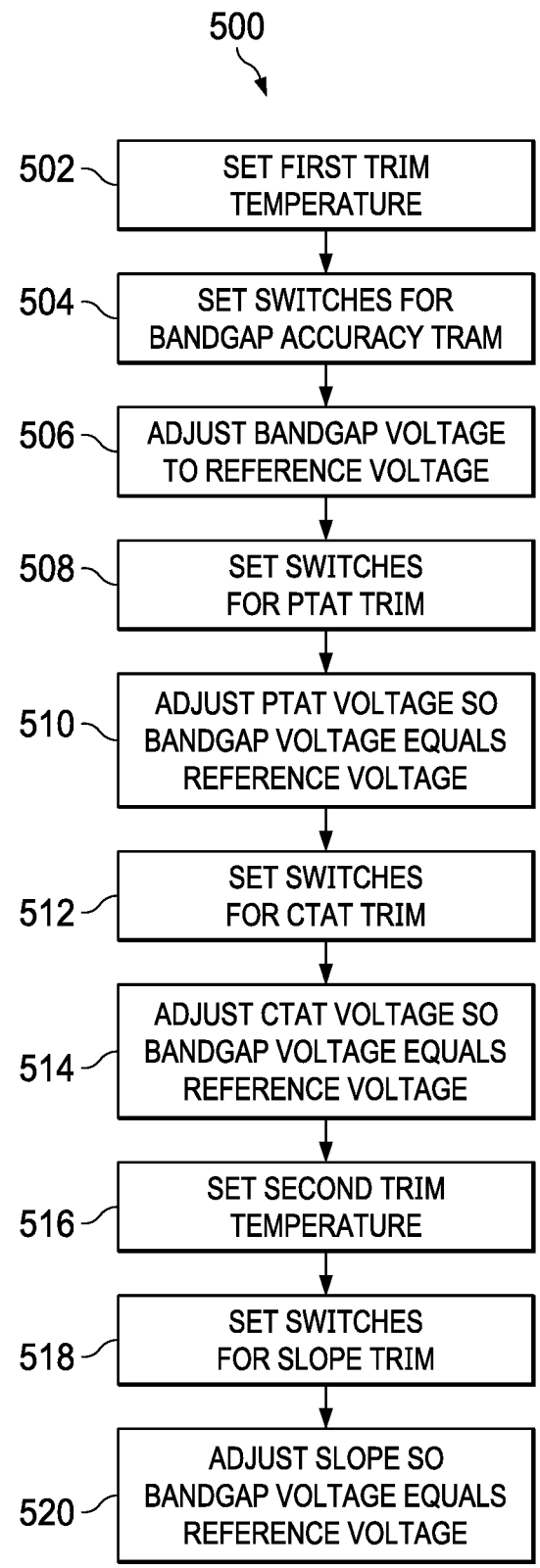
FIG. 5 shows a flow diagram for a method for trimming a voltage reference circuit that that includes voltage output temperature compensation in accordance with the present disclosure.

FIG. 5 shows a flow diagram for a method 500 for trimming a voltage reference circuit that includes voltage output temperature compensation in accordance with the present disclosure. Though depicted sequentially as a matter of convenience, at least some of the actions shown can be performed in a different order and/or performed in parallel. Additionally, some implementations may perform only some of the actions shown. In some implementations, at least some of the operations of the method 500 can be implemented by the voltage reference circuit voltage reference circuit 300.

In block 502, the voltage reference circuit 300 is being trimmed for temperature compensation. For example, the process of manufacturing the voltage reference circuit 300 includes the method 500 to trim the voltage reference circuit 300 for temperature compensation. To adjust the temperature compensation, the voltage reference circuit 300 is set to a first trim temperature. For example, the temperature of the voltage reference circuit 300 may be raised to 90 degrees Celsius. The temperature of the voltage reference circuit 300 may be set to a different value in some implementations.

In block 504, the switch 314, the switch 316, and the switch 318 are set to perform a bandgap accuracy trim. For example, the switch 314 is opened to isolate the bandgap circuit 302 from the resistive digital-to-analog converter 312.

In block 506, the output voltage 114 generated by the bandgap circuit 302 is compared to a reference voltage, and is adjusted to make the output voltage 114 equal to the reference voltage. The output voltage 114 is adjusted by selecting a tap point of the resistive digital-to-analog converter 326 at which the bandgap current 336 provided to the resistive digital-to-analog converter 326 produces an output voltage 114 equaling the reference voltage. For example, a binary search of the taps of the resistive digital-to-analog converter 326 is performed to identify the tap that produces a value of the output voltage 114 that best corresponds to the reference voltage.

In block 508, the switch 314, the switch 316, and the switch 318 are set to trim the output voltage 120 (the PTAT voltage) in the resistive digital-to-analog converter 310. For example, the switch 314 is closed, the switch 316 is closed, and the switch 318 is opened to connect the output of the resistive digital-to-analog converter 310 to the bandgap circuit 302, and disconnect the output of the resistive digital-to-analog converter 308 from the bandgap circuit 302.

In block 510, feedback signal generated by the PTAT voltage generation circuit 304 and scaled by the resistive digital-to-analog converter 310 is provided to the bandgap circuit 302. The output voltage 114 generated by the bandgap circuit 302 is compared to the reference voltage, and the output voltage 120 produced by the resistive digital-to-analog converter 310 is adjusted to make the output voltage 114 equal to the reference voltage. The resistive digital-to-analog converter 310 is adjusted by selecting a tap point of the resistive digital-to-analog converter 310 at which the output voltage 120 provided to the resistive digital-to-analog converter 312 results in the output voltage 114 equaling the reference voltage. For example, a binary search of the taps of the resistive digital-to-analog converter 310 is performed to identify the tap that produces a value of the output voltage 114 that best corresponds to the reference voltage.

In block 512, the switch 314, the switch 316, and the switch 318 are set to trim the output voltage 122 (the CTAT voltage). For example, the switch 314 is closed, the switch 316 is opened, and the switch 318 is closed to connect the output of the resistive digital-to-analog converter 308 to the bandgap circuit 302, and disconnect the output of the resistive digital-to-analog converter 310 from the bandgap circuit 302.

In block 514, feedback signal generated by the CTAT voltage generation circuit 306 and scaled by the resistive digital-to-analog converter 308 is provided to the bandgap circuit 302. The output voltage 114 generated by the bandgap circuit 302 is compared to the reference voltage, and the output voltage 122 produced by the resistive digital-to-analog converter 308 is adjusted to make the output voltage 114 equal to the reference voltage. The resistive digital-to-analog converter 308 is adjusted by selecting a tap point of the resistive digital-to-analog converter 308 at which the output voltage 122 provided to the resistive digital-to-analog converter 312 results in the output voltage 114 equaling the reference voltage. For example, a binary search of the taps of the resistive digital-to-analog converter 308 is performed to identify the tap that produces a value of the output voltage 114 that best corresponds to the reference voltage.

The adjustments of the blocks 506, 510, and 514 are performed with the voltage reference circuit 300 at the first trim temperature. In block 516, the voltage reference circuit 300 is set to a second trim temperature. For example, the temperature of the voltage reference circuit 300 may be lowered to 25 degrees Celsius. The temperature of the voltage reference circuit 300 may be set to a different value in some implementations.

In block 518, the switch 314, the switch 316, and the switch 318 are set to trim the slope of the output voltage 124 (e.g., to set the rate of change of the output voltage 124 with temperature). For example, the switch 314 is closed, the switch 316 is closed, and the switch 318 is closed to connect the output of the resistive digital-to-analog converter 308 and the output of the resistive digital-to-analog converter 310 to the bandgap circuit 302.

In block 520, feedback signal generated by the CTAT voltage generation circuit 306 (as scaled by the resistive digital-to-analog converter 308) and feedback signal generated by the PTAT voltage generation circuit 304 (as scaled by the resistive digital-to-analog converter 310) is summed by the resistive digital-to-analog converter 312 and provided to the bandgap circuit 302. The weighting of the output voltage 120 and the output voltage 122 is set by selecting a tap of the resistive digital-to-analog converter 312 that causes the output voltage 114 to equal the reference voltage. The output voltage 114 generated by the bandgap circuit 302 is compared to the reference voltage, and the output voltage 124 produced by the resistive digital-to-analog converter 312 is adjusted to make the output voltage 114 equal to the reference voltage. The resistive digital-to-analog converter 312 is adjusted by selecting a tap point of the resistive digital-to-analog converter 312 at which the output voltage 124 provided to the resistive digital-to-analog converter 312 results in the output voltage 114 equaling the reference voltage. For example, a binary search of the taps of the resistive digital-to-analog converter 312 is performed to identify the tap that produces a value of the output voltage 114 that best corresponds to the reference voltage.

While the temperature compensation circuitry disclosed herein has been generally described in the context of a voltage reference circuit, the temperature compensation circuitry is applicable to a wide variety of circuits that experience drift with temperature. For example, an implementation of the temperature compensation circuitry disclosed herein may be included in an operational amplifier to correct for offset drift, or included in any circuit that includes a bandgap reference to compensate for drift in the bandgap reference.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A voltage reference circuit, comprising:
    a bandgap circuit; and
    a temperature compensation circuit, comprising:
        a first trim circuit;
        a second trim circuit;
        a first resistive digital-to-analog converter coupled to the first trim circuit, the second trim circuit, and the bandgap circuit; the first resistive digital-to-analog converter configured to:
            generate a temperature compensation voltage; and
            provide the temperature compensation voltage to the bandgap circuit;
    wherein the first trim circuit comprises a proportional to absolute temperature voltage generation circuit and a second resistive digital-to-analog converter.

2. The voltage reference circuit of claim 1, wherein an output terminal of the second resistive digital-to-analog converter is coupled to an input terminal of the first resistive digital to analog converter.

3. The voltage reference circuit of claim 1, wherein the proportional to absolute temperature voltage generation circuit is configured to generate a voltage proportional to absolute temperature as a function of output of the bandgap circuit.

4. The voltage reference circuit of claim 1, wherein the proportional to absolute temperature voltage generation circuit is configured to generate a voltage proportional to absolute temperature as output voltage of the bandgap circuit less three diode drop voltages.

5. A voltage reference circuit, comprising:
    a bandgap circuit; and
    a temperature compensation circuit, comprising:
        a first trim circuit;
        a second trim circuit;
        a first resistive digital-to-analog converter coupled to the first trim circuit, the second trim circuit, and the bandgap circuit; the first resistive digital-to-analog converter configured to:
            generate a temperature compensation voltage; and
            provide the temperature compensation voltage to the bandgap circuit;
    wherein the second trim circuit comprises a complementary to absolute temperature voltage generation circuit and a third resistive digital-to-analog converter.

6. The voltage reference circuit of claim 5, wherein an output terminal of the third resistive digital-to-analog converter is coupled to an input terminal of the first resistive digital to analog converter.

7. The voltage reference circuit of claim 5, wherein the complementary to absolute temperature voltage generation circuit is configured to generate a voltage complementary to absolute temperature as a function of output of the bandgap circuit.

8. The voltage reference circuit of claim 5, wherein the complementary to absolute temperature voltage generation circuit is configured to generate a voltage complementary to absolute temperature as two diode drop voltages.

9. A temperature compensation circuit, comprising:
    a bandgap circuit;
    a proportional to absolute temperature voltage generation circuit;
    a complementary to absolute temperature voltage generation circuit;
    a first resistive digital-to-analog converter coupled to an output of the proportional to absolute temperature voltage generation circuit;
    a second resistive digital-to-analog converter coupled to an output of the complementary to absolute temperature voltage generation circuit;
    a third resistive digital-to-analog converter coupled to:
        an output of the first resistive digital-to-analog converter;
        an output of the second resistive digital-to-analog converter; and
        an input of the bandgap circuit.

10. The voltage reference circuit of claim 9, further comprising:
    a first switch that connects the first resistive digital-to-analog converter to the third resistive digital-to-analog converter;
    a second switch that connects the second resistive digital-to-analog converter to the third resistive digital-to-analog converter; and
    a third switch that connects the third resistive digital-to-analog converter to the bandgap circuit.

* * * * *